United States Patent [19]

Hattori

[11] Patent Number: 4,788,666

[45] Date of Patent: Nov. 29, 1988

[54] MEMORY UNITS WITH NORMAL AND BIT SELECT WRITE MODES

[75] Inventor: Tomoaki Hattori, Nagoya, Japan

[73] Assignee: Brother Kogyo Kabushiki Kaisha, Nagoya, Japan

[21] Appl. No.: 165,926

[22] Filed: Mar. 9, 1988

[30] Foreign Application Priority Data

Mar. 13, 1987 [JP] Japan .................................. 62-59797

[51] Int. Cl.⁴ .......................... G11C 7/00; G11C 8/00; G11C 11/34
[52] U.S. Cl. .................................. 365/189; 365/230; 365/233
[58] Field of Search ........................ 365/189, 230, 233

[56] References Cited

U.S. PATENT DOCUMENTS 4,558,433 12/1985 Bernstein ..................... 365/230 X
4,623,990 11/1986 Allen et al. ..................... 365/230 X

*Primary Examiner*—Stuart N. Hecker
*Assistant Examiner*—Alyssa H. Bowler
*Attorney, Agent, or Firm*—Kane, Dalsimer, Sullivan, Kurucz, Levy, Eisele and Richard

[57] ABSTRACT

A memory unit includes a dual port memory provided with a RAS input terminal and a WB/WE input terminal adapted to receive a RAS clock signal and a bit select clock signal, respectively. A first signal generator generates the RAS clock signal and the bit select write signal of a timing, at which the dual port memory performs the normal write operation, whereas the bit select write operation is carried out in response to these clock signals supplied from a second signal generator at another timing. A selective one of the first and second signal generators is made operative in response to at least one bit mode-specifying data supplied from a CPU. Both of the first and second signal generators receive a continuous signal from CPU so that these signal generators are in a position to send the signals of different timings to the dual port memory responsive to the mode-specifying data.

3 Claims, 2 Drawing Sheets

MEMORY UNITS WITH NORMAL AND BIT SELECT WRITE MODES

BACKGROUND OF THE INVENTION

This invention relates to a memory unit utilizing memory means adapted to perform a bit select write operation on data stored in a predetermined storage area and a newly transferred data and to store the operation results in said predetermined storage area.

In conventional memory units, when a data already stored in a certain address and a newly entered data are to be subjected to, for instance, an OR operation, to store the results in said certain address, a central processing unit (CPU) operates to read the data stored in the certain address, to perform OR operation between this data and the new data and to send the results back to the certain address. This means that CPU has to issue at least three commands, making it difficult to reduce the time required for the operation.

In order to solve this problem, there has been proposed to use a memory element which is operated such that a so-called bit select write operation is performed on a data existing in said pre-selected storage area with respect to a new data, said operation being effected directly on said pre-selected storage area to store the results in the same area.

Such a memory element is known as a dual port memory. Access to the dual port memory for the normal write operation and the bit select write operation can be achieved through the respective input terminals, one for the normal write operation being in general referred to as a row strobe address input terminal (RAS terminal) and the other for the bit select write operation as a write per bit control/ write enable input terminal (WB/WE terminal).

Setting the dual port memory to the normal write mode is accomplished by setting the WB/WE clock signal (write clock signal) sent from CPU to the WB/WE terminal to a high level at the trailing edge of the RAS clock signal which is likewise sent from CPU to the RAS terminal. In contrast, when setting the write clock signal to a low level at the trailing edge of the RAS clock signal, the dual port memory is switched to the bit select write mode.

In this arrangement, however, CPU has also been necessary to provide with different kind of commands for switching the mode of the dual port memory, which will be a bar to a development of faster processing operation.

SUMMARY OF THE INVENTION

It is therefore an object of this invention to provide a memory unit capable of operating a given processing operation in a satisfactorily fast fashion.

Another object of this invention is to provide a novel memory unit having a central processing unit which has no need to give different commands for switching function of a dual port memory between the normal write mode and the bit select write mode.

According to an aspect of this invention there is provided a memory unit comprising a memory element operated in response to a RAS clock signal and a bit select clock signal to selectively perform a normal write operation for storing data in a given storage area thereof of a bit select write operation for operating a data stored in a predetermined storage area thereof with respect to a newly supplied data to store the results in the same storage area where the data has been stored; a first timing signal generator for supplying to the memory element the RAS clock signal and the bit select clock signal at a first timing whereat the memory element performs the normal write operation; a second timing signal generator for supplying to the memory element the RAS clock signal and the bit select clock signal at a second timing whereat the memory element performs the bit select write operation; control means for generating said data and address data including at least one bit data assigned to specify either the normal write operation and the bit select write operation, and for transferring to both the first and second timing signal generators a first write command signal; and data select means operated in response to said at least one bit data to send a second write command signal to a selective one of the first and second timing signal generators, said selective one of the generators being operated in response to said first and second write command signals to drive for effecting a corresponding one of operational modes of the memory element.

BRIEF DESCRIPTION OF THE ACCOMPANYING DRAWINGS

In the accompanying drawings.

DESCRIPTION OF THE PREFERRED EMBODIMENTS

Figure 1:
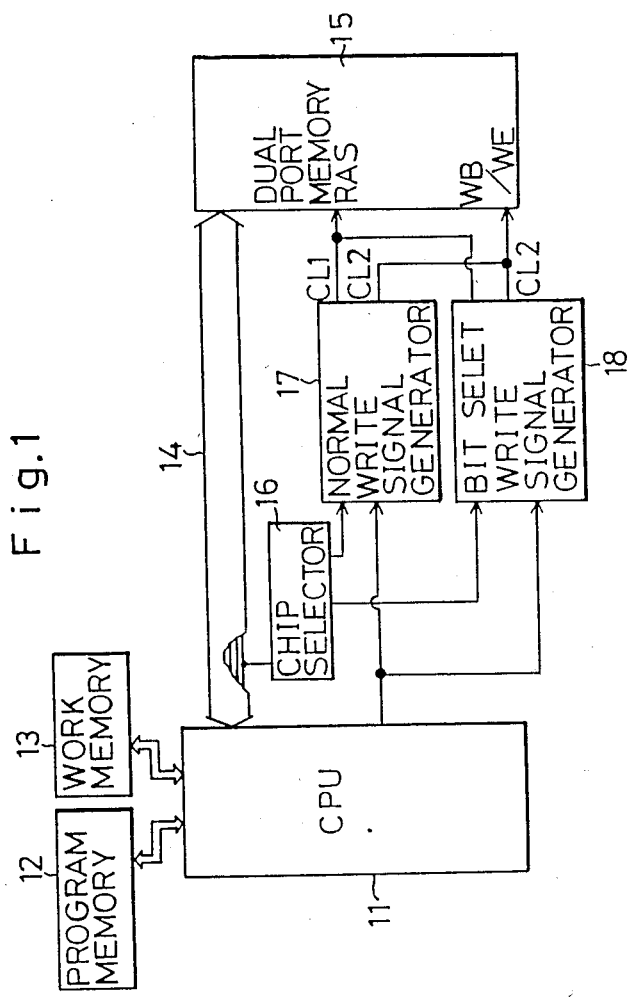
FIG. 1 is a block diagram of a memory unit embodying the invention.

Referring to FIG. 1, a central processing unit 11 (which is simply referred to as CPU hereinlater) is provided with a program memory 12 storing a control program and a work memory 13 for temporarily storing the operation results of CPU 11 to perform operations in accordance with the control program. CPU 11 sends to a dual port memory 15 via a data bus 14 address data to be written into the memory 15. The address data as a whole accommodates more than 16 bits, including 8 bits of column address data, 8 bits of row address data and at least one bit higher than these 16 bits used as a data for specifying either the normal write mode or the bit select write mode. In this embodiment, when this additional one bit is "0", it is considered as specifying the normal write mode, while the bit "1" represents the bit select write mode.

Figure 2:
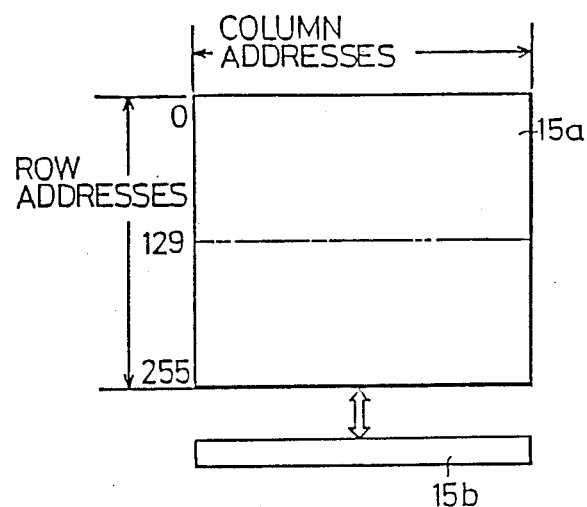
FIG. 2 is an explanatory view illustrating the dual port memory used for the memory unit of FIG. 1.

The dual port memory 15 includes a random access memory (RAM) 15a and a serial access memory (SAM) 15b, as shown in FIG. 2. RAM 15a consists of a memory cell array of 256×1024 bits, the storage area of which is divided into row addresses and column addresses. The row addresses range from 0 to 255 and the column addresses for each row address cover 0 to 255 with four bits assigned to each column. A certain storage area is selected in accordance with a row address data and column address data supplied from CPU 11.

The mode-specifying one bit is entered into the memory 15 as an address data. Although a virtual storage area is provided for RAM 15a of the memory 15, the said one bit is nullified by a built-in address controller (not shown) as it is located at an address higher than 16 bits.

SAM 15b accommodates 1×1024 bits to retain a 1×1024 bit data (1-frame data) stored in each column address per row address within RAM 15a.

Figure 3A:
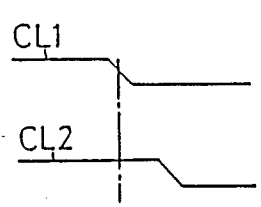
FIG. 3(a) and 3(b) are time chart of RAS clock signal and write clock signal for selecting between the normal write mode and the bit select write mode of the dual port memory.
Figure 3B:
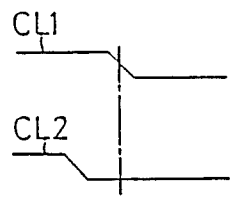

The dual port memory 15 is provided with a RAS terminal and a WB/WE terminal. The memory is set to the normal write mode when, as shown in FIG. 3(a), write clock signal $CL_2$ output at WB/WE terminal is at a high level at the trailing edge of RAS clock signal received at the RAS terminal. On the other hand, it is set to the bit select write mode when write clock signal $CL_2$ is at a low level at the trailing edge of RAS clock signal $CL_1$, as shown in FIG. 3(b).

A chip selector 16 serving as a data selecting means receives via the data bus 14 the mode-specifying one bit data. When the mode-specifying one bit data is "0", it determines the normal write mode to be selected and sends a drive control signal to a normal write mode signal generator circuit 17. With the mode-specifying one bit data of "1", on the other hand, the chip selector 16 is operated to select the bit select write mode to send a drive control signal to a bit select write signal generating circuit 18.

The normal write signal generator 17 responds to the drive control signal from the tip selector 16 and the write control signal from CPU 11 to generate the RAS clock signal $CL_1$ and the write clock signal $CL_2$ at the RAS terminal and WB/WE terminal of the dual port memory 15 respectively, to thereby set the memory to the normal write mode. The bit select write signal generator 18 likewise responds to the drive control signal and the write control signal to generate the RAS clock signal $CL_1$ and the write clock signal $CL_2$ at the RAS terminal and WB/WE terminal of the dual port memory 15 respectively, to thereby set the memory to the bit select write mode for composition of characters other than those preset in the memory to be printed. For example, the symbol representing unit of Japanese currency "¥" is compounded of "Y" and "=", and "Ä" is of "A" and "¨". A bold-faced character can be prepared also in the bit select write mode by printing the same character twice or more at slightly different points of the printing paper.

The memory unit arranged as explained above will be operated as described below.

Now suppose that the data should be written in the area defined by row addresses 0 to 255 and column addresses 0 to 255 of RAM 15a of the dual port memory 15. CPU 11 transfers column address data and row address data to the dual port memot memory 15 via data bus 14, while sending a write control signal to the normal write signal generator 17 and the bit select write signal generator 18. At this time, CPU 11 sets the mode-specifying one bit data to "0".

With the address specified in RAM 15a in accordance with the column and row address data, the chip selector 16 determines the normal write mode to be selected in response to the mode-spedifying one bit data of "0" and thus feeds a drive control signal to the normal write signal generator 17.

The normal write signal generator 17 then sends a RAS clock signal $CL_1$ to the RAS input terminal and also a write clock signal $CL_2$ to the WB/WE input terminal in response to the drive control signal and write control signal to thereby set the dual port memory 15 to the normal write mode.

The dual port memory 15 is thus set to a normal write mode in accordance with the clock signals $CL_1$ and $CL_2$, and writes the data transferred from CPU 11 into the addresses specified by the respective address data.

Now supposed an OR operation is performed on the data stored at a given address within the row addresses of 0 to 255 and the column addresses of 0 to 255 and a new data transferred from CPU 11, and the result of operation is written into the specified address. The operation procedures are described as follows.

CPU 11 transfers the column and row address data to be operated to the dual port memory 15 via data bus 14, while feeding a write control signal to the signal generators 17 and 18 as described earlier. At this time, the mode-specifying one bit data sent from CPU 11 is "1".

The address within RAM 15a is specified by the column and row address data, while the chip selector 16 determines that the bit select write mode has been selected because the one bit data is "1" to generate a drive control signal at the bit select write signal generator 18.

The bit select write signal generator 18 delivers RAS clock signal $CL_1$ to the RAS input terminal and write clock signal $CL_2$ to the WB/WE input terminal in response to the drive control signal and write control signal so as to set the dual port memory 15 to the bit select write mode.

The dual port memory 15 is thus set to the bit select write mode in accordance with clock signals $CL_1$ and $CL_2$ received from the bit select write signal generator 18. It then performs OR operations on the data transferred from CPU 11 and the data stored in the address specified above and stores the operation results in the same address. For instance, the operation result stored in the specified address is "1, 0, 1, 1", when the data stored in the specified address is "1, 0, 1, 0" and the data transferred from CPU 11 is "1, 0, 0, 1".

According to this embodiment, therefore, one bit of address data is assigned as a data for specifying either the normal write mode or a bit select write mode and the chip selector 16 determines the mode selected. Thus, selected one of the signal generators 17 and 18 is operated in response to a signal from the chip selector 16 to output RAS clock signal $CL_1$ and write clock signal $CL_2$. Accordingly, CPU 11 has only to deliver the write control signal to the normal write signal generator 17 and the bit select write signal generator 18. As a result, it is not necessary to reset mode every time the write mode is changed, obviating time loss to achieve a faster operation processing.

It should be understood that this invention be not limited to a specific embodiment thereof illustrated herein. For instance, the mode-specifying one bit data can be replaced by any one of 8 row address bits (the highest bit, for example) or at a given bit of column address data.

What is claimed is:

1. A memory unit comprising a memory element operated in response to a RAS clock signal and a bit select clock signal to selectively perform a normal write operation for storing data in a given storage area thereof or a bit select write operation for operating a data stored in a predetermined storage area thereof with respect to a newly supplied data to store the results in the same storage area where the data has been stored; a first timing signal generator for supplying to said memory element the RAS clock signal and the bit select clock signal at a first timing whereat said memory element performs the normal write operation; a second timing signal generator for supplying to said memory element the RAS clock signal and the bit select clock signal at a second timing whereat said memory element performs the bit select write operation; control means for generating said data and address data including at least one bit data assigned to specify either the normal write operation and the bit select write operation, and for transferring to said first and second timing signal generators respectively a first write command signal; and data select means operated in response to said at least one bit data to send a second write command signal to a selective one of said first and second timing signal generators, said selective one of said generators being operated in response to said first and second write command signals to drive for effecting a corresponding one of operational modes of said memory element.

2. The memory unit according to claim 1 wherein said first timing signal generator is made operative to allow said memory element to perform the normal write operation when the bit select clock signal is at a high level at a trailing edge of the RAS clock signal, while said second timing signal generator is made operative to allow said memory element to perform the bit select write operation when the bit select clock signal is at a low level at a trailing edge of the RAS clock signal.

3. The memory unit according to claim 1 wherein said memory element is in the shape of a dual port memory provided with first and second input terminals adapted to receive the RAS clock signal and the bit select clock signal, respectively.

* * * * *